(12) United States Patent
Saito et al.

(10) Patent No.: US 9,780,205 B2
(45) Date of Patent: **\*Oct. 3, 2017**

(54) INSULATED GATE TYPE SEMICONDUCTOR DEVICE HAVING FLOATING REGIONS AT BOTTOM OF TRENCHES IN CELL REGION AND CIRCUMFERENTIAL REGION AND MANUFACTURING METHOD THEREOF

(71) Applicants: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(72) Inventors: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 15/104,332

(22) PCT Filed: Aug. 4, 2014

(86) PCT No.: PCT/JP2014/070520
§ 371 (c)(1),
(2) Date: Jun. 14, 2016

(87) PCT Pub. No.: WO2015/098167
PCT Pub. Date: Jul. 2, 2015

(65) Prior Publication Data
US 2016/0329422 A1 Nov. 10, 2016

(30) Foreign Application Priority Data

Dec. 26, 2013 (JP) ................. 2013-269264

(51) Int. Cl.
*H01L 29/78* (2006.01)
*H01L 21/761* (2006.01)
(Continued)

(52) U.S. Cl.
CPC ........ *H01L 29/7811* (2013.01); *H01L 21/761* (2013.01); *H01L 29/0623* (2013.01);
(Continued)

(58) Field of Classification Search
CPC ............. H01L 29/7811; H01L 29/1608; H01L 29/7813; H01L 29/0623; H01L 29/66068
See application file for complete search history.

(56) References Cited

U.S. PATENT DOCUMENTS

2004/0248389 A1 12/2004 Iwabuchi
2008/0087951 A1 4/2008 Takaya et al.
(Continued)

FOREIGN PATENT DOCUMENTS

CN 101048874 A 10/2007
JP 2005-223349 A 8/2005
(Continued)

OTHER PUBLICATIONS

U.S. Appl. No. 15/124,920, filed Sep. 9, 2016 in the name of Saito et al.
(Continued)

*Primary Examiner* — Michael Jung
(74) *Attorney, Agent, or Firm* — Oliff PLC

(57) ABSTRACT

A technique disclosed herein improves a voltage resistance of an insulated gate type semiconductor device. A provided method is a method for manufacturing an insulated gate type switching device configured to switch between a front surface electrode and a rear surface electrode. The method includes implanting a first kind of second conductivity type impurities to bottom surfaces of gate trenches and diffusing
(Continued)

the implanted first kind of second conductivity type impurities, and implanting a second kind of second conductivity type impurities to the bottom surfaces of the circumferential trenches and diffusing the implanted second kind of second conductivity type impurities.

6 Claims, 12 Drawing Sheets

(51) Int. Cl.
  *H01L 29/06* (2006.01)
  *H01L 29/16* (2006.01)
  *H01L 29/66* (2006.01)
  *H01L 21/04* (2006.01)

(52) U.S. Cl.
  CPC .... *H01L 29/1608* (2013.01); *H01L 29/66068* (2013.01); *H01L 29/7813* (2013.01); *H01L 21/046* (2013.01)

(56) References Cited

U.S. PATENT DOCUMENTS

| | | | |
|---|---|---|---|
| 2010/0224932 A1* | 9/2010 | Takaya | H01L 29/0623 257/330 |
| 2012/0326207 A1* | 12/2012 | Yoshimochi | H01L 29/866 257/139 |
| 2013/0087852 A1 | 4/2013 | Kim et al. | |
| 2013/0207172 A1* | 8/2013 | Hsieh | H01L 29/41766 257/315 |
| 2014/0221427 A1* | 8/2014 | Muller | C07D 401/04 514/323 |
| 2016/0211319 A1 | 7/2016 | Saito et al. | |
| 2017/0025516 A1 | 1/2017 | Saito et al. | |

FOREIGN PATENT DOCUMENTS

| | | |
|---|---|---|
| JP | 2006-128507 A | 5/2006 |
| JP | 2007-173319 A | 7/2007 |
| JP | 2008-135522 A | 6/2008 |
| JP | 2010-062361 A | 3/2010 |
| JP | 2012-238741 A | 12/2012 |
| JP | 2015-065237 A | 4/2015 |
| JP | 2015-126085 A | 7/2015 |
| TW | 200302556 A | 8/2003 |
| TW | 201322451 A1 | 6/2013 |

OTHER PUBLICATIONS

May 4, 2017 Notice of Allowance issued in U.S. Appl. No. 15/124,920.

* cited by examiner

INSULATED GATE TYPE SEMICONDUCTOR DEVICE HAVING FLOATING REGIONS AT BOTTOM OF TRENCHES IN CELL REGION AND CIRCUMFERENTIAL REGION AND MANUFACTURING METHOD THEREOF

TECHNICAL FIELD

Cross-Reference to Related Applications

This application is a related application of Japanese Patent Application No. 2013-269264 filed on Dec. 26, 2013 and claims priority to this Japanese Patent Application, the entire contents of which are hereby incorporated by reference into the present application.

The technique disclosed herein relates to an insulated gate type semiconductor device.

BACKGROUND ART

Japanese Patent Application Publication No. 2008-135522 (hereinbelow referred to as Patent Literature 1) discloses an insulated gate type semiconductor device including an element region in which a MOS structure is provided, and a circumferential region on a periphery of the element region. A plurality of gate trenches is provided in the element region, and a gate insulating film and a gate electrode are provided within each gate trench. A p-type bottom-surface surrounding region (hereinbelow referred to as element-bottom-surface surrounding region) is provided in a range exposed on a bottom surface of each trench. The circumferential region has a plurality of trenches provided so as to surround the element region. A p-type bottom-surface surrounding region (hereinbelow referred to as outer circumferential bottom-surface surrounding region) is provided in a range exposed on a bottom surface of each trench in the circumferential region. When a MOSFET is turned off, a depletion layer extends in the element region from the element-bottom-surface surrounding regions to a drift region. Due to this, depletion of the drift region in the element region is enhanced. Further, in the circumferential region, the depletion layer extends within the drift region from the outer circumferential bottom-surface surrounding regions. Due to this, depletion of the drift region in the circumferential region is enhanced. Accordingly, a voltage resistance of the insulated gate type semiconductor device is thereby improved.

SUMMARY

Technical Problem

In the insulated gate type semiconductor device of Patent Literature 1, the depletion layer extends substantially simultaneously in the element region from the respective element-bottom-surface surrounding regions. Thus, the depletion progresses from both sides of the drift region at portions interposed between pairs of element-bottom-surface surrounding regions, so the depletion is easily facilitated. On the other hand, in the circumferential region, when the depletion layer extending from the element region reaches the first outer circumferential bottom-surface surrounding region in the circumferential region (the outer circumferential bottom-surface surrounding region closest to the element region), the depletion layer extends from the first outer circumferential bottom-surface surrounding region toward the second outer circumferential bottom-surface surrounding region (the second outer circumferential bottom-surface surrounding region from the element region). When the depletion layer reaches the second outer circumferential bottom-surface surrounding region, the depletion layer extends from the second outer circumferential bottom-surface surrounding region toward the third outer circumferential bottom-surface surrounding region. As above, the depletion layer gradually extends through the respective outer circumferential bottom-surface surrounding regions. Due to this, in the drift region at portions interposed between pairs of outer circumferential bottom-surface surrounding regions, the depletion progresses only from one side. Due to this, the circumferential region is depleted with less case. Thus, a further improvement in a voltage resistance of the circumferential region is desired.

Solution to Problem

A method disclosed herein is a method for manufacturing an insulated gate type semiconductor device that comprises a semiconductor substrate, a front surface electrode, and rear surface electrode. The front surface electrode is provided on a front surface of the semiconductor substrate. The rear surface electrode is provided on a rear surface of the semiconductor substrate. The insulated gate type semiconductor device is configured to switch between the front surface electrode and the rear surface electrode. The insulated gate type semiconductor device comprises a first region, a second region, a third region, a plurality of gate trenches, gate insulating films and gate electrodes, fourth regions, a plurality of circumferential trenches, insulating layers, and an fifth regions. The first region is of a first conductivity type and connected to the front surface electrode. The second region is of a second conductivity type and in contact with the first region. The third region is of the first conductivity type and separated from the first region by the second region. The plurality of gate trenches is provided in the front surface of the semiconductor substrate and penetrating the second region to reach the third region. The gate insulating films and the gate electrodes are provided in the gate trenches. The fourth regions are of the second conductivity type and provided in ranges exposed on bottom surfaces of the gate trenches. The plurality of circumferential trenches are provided in the front surface of the semiconductor substrate in a region outside the second region. The insulating layers are provided in the circumferential trenches. The fifth regions of the second conductivity type are provided in ranges exposed on bottom surfaces of the circumferential trenches. The method comprises forming the gate trenches; forming the circumferential trenches; forming the fourth regions by implanting a first kind of second conductivity impurities to the bottom surfaces of the gate trenches and diffusing the implanted first kind of second conductivity type impurities; and forming the fifth regions by implanting a second kind of second conductivity type impurities to the bottom surfaces of the circumferential trenches and diffusing the implanted second kind of second conductivity type impurities. A diffusion coefficient of the second kind, of second conductivity type impurities in the formation of the fifth regions is larger than a diffusion coefficient of the first kind of second conductivity type impurities in the formation of the fourth regions.

Notably, whichever of the gate trenches and the circumferential trenches may be formed first. Further, whichever of the implantation of the impurities to the bottom surfaces of the gate trenches and the implantation of the impurities to the bottom surfaces of the circumferential trenches may be performed first. Further, whichever of the diffusion of the impurities implanted to the bottom surfaces of the gate trenches and the diffusion of the impurities implanted to the bottom surfaces of the circumferential trenches may be performed first, or they may be performed simultaneously.

In this method, the diffusion coefficient for the second p-type impurities in the formation of the fifth regions is large. Thus, the second p-type impurities can be diffused to broader ranges so that wider fifth regions can be formed. Due to this, clearances between the fifth regions can be narrowed, and these clearances can be depleted with greater case. Thus, according to this method, the voltage resistance in the outer circumferential portion can be improved. On the other hand, the diffusion coefficient for the first p-type impurities in the formation of the fourth regions is small. Thus, the diffused ranges of the first p-type impurities is narrowed, and a width of the fourth regions becomes narrowed. By making the width of the fourth regions narrow, clearances between the fourth regions (that is, a current passage) can be ensured to be wide. Due to this, an on-voltage of the insulated gate type semiconductor device can be reduced.

In the above-mentioned method, the first p-type impurities may be of a different element from the second p-type impurities.

In the above-mentioned method, the first kind of second conductivity type impurities and the second kind of second conductivity type impurities may be boron. Boron and carbon may be implanted to the bottom surfaces of the gate trenches in the formation of the fourth regions.

According to any of these methods, the diffusion coefficient for the second p-type impurities in the formation of the fifth regions can be made larger than the diffusion coefficient for the first p-type impurities in the formation of the fourth regions.

In any of the above mentioned methods, the second kind of second conductivity type impurities and third kind of second conductivity type impurities may be implanted to the bottom surfaces of the circumferential trenches in the formation of the fifth regions. A diffusion coefficient of the third kind of second conductivity impurities in the formation of the fourth regions may be smaller than a diffusion coefficient of the second kind of second conductivity type impurities in the formation of the fourth regions.

In any of the above mentioned methods, in the formation of the fifth regions, the second kind of second conductivity type impurities may be implanted at a concentration by which at least parts of semiconductor layers constituting the bottom surfaces of the circumferential trenches become amorphous.

In any of the above mentioned methods, in the formation of the fifth regions, the second kind of second conductivity type impurities may be implanted to the bottom surfaces of the circumferential trenches at a concentration equal to or higher than $1 \times 10^{18}$ atoms/cm$^3$.

According to any of these methods, the p-type impurity concentration of regions within the fifth region in a vicinity of bottom surfaces of the circumferential trenches can be made high. According to this, a generation of a high electric field in the vicinity of the bottom surfaces of the circumferential trenches can be suppressed.

In any of the above mentioned methods, a clearance between each pair of adjacent fifth regions may be less than half of a clearance between each pair of adjacent fourth regions.

According to this configuration, an avalanche breakdown would occur in the element portion before the outer circumferential portion. Since the element portion has a high avalanche resistivity, the voltage resistance of the insulated gate type semiconductor device is improved by causing the first avalanche breakdown to occur in the element portion.

Further, this disclosure provides a new insulated gate type semiconductor device. The insulated gate type semiconductor device disclosed herein comprises: a semiconductor substrate; a front surface electrode provided on a front surface of the semiconductor substrate; and a rear surface electrode provided on a rear surface of the semiconductor substrate. The insulated gate type semiconductor device is configured to switch between the front surface electrode and the rear surface electrode. The insulated gate type semiconductor device comprises: a first region of a first conductivity type connected to the front surface electrode; a second region of a second conductivity type being in contact with the first region; a third region of the first conductivity type separated from the first region by the second region; a plurality of gate trenches provided in the front surface and penetrating the first region and the second region to reach the third region; gate insulating films and gate electrodes provided in the gate trenches; fourth regions of the second conductivity type provided in ranges exposed on bottom surfaces of the gate trenches; a plurality of circumferential trenches provided in the front surface at positions where the circumferential trenches are not in contact with the second region; insulating layers provided in the circumferential trenches; and fifth regions of the second conductivity type provided in ranges exposed on bottom surfaces of the circumferential trenches. A width of the fifth regions is wider than a width of the fourth regions. Second conductivity type impurities included in the fourth regions may be an element different from second conductivity type impurities included in the fifth regions. Second conductivity type impurities included in the fourth regions and second conductivity type impurities in the fifth regions may be boron, and carbon may be further included in the fourth regions. A first specific kind of second conductivity type impurities and a second specific kind of second conductivity type impurities may be included in the fifth regions. A diffusion coefficient of the second specific kind of second conductivity type impurities in the semiconductor substrate may be smaller than a diffusion coefficient of the first specific kind of second conductivity type impurities in the semiconductor substrate. At least parts of the bottom surfaces of the circumferential trenches may be configured of amorphous layers. At least parts of the bottom surfaces of the circumferential trenches may include second conductivity impurities at a density equal to or higher than $1 \times 10^{18}$ atoms/cm$^3$. A clearance between each pair of adjacent fifth regions may be less than half of a clearance between each pair of adjacent fourth regions. According to these configurations described above, a voltage resistance of the insulated gate type semiconductor device can be improved.

DETAILED DESCRIPTION

Embodiments

Figure 1:
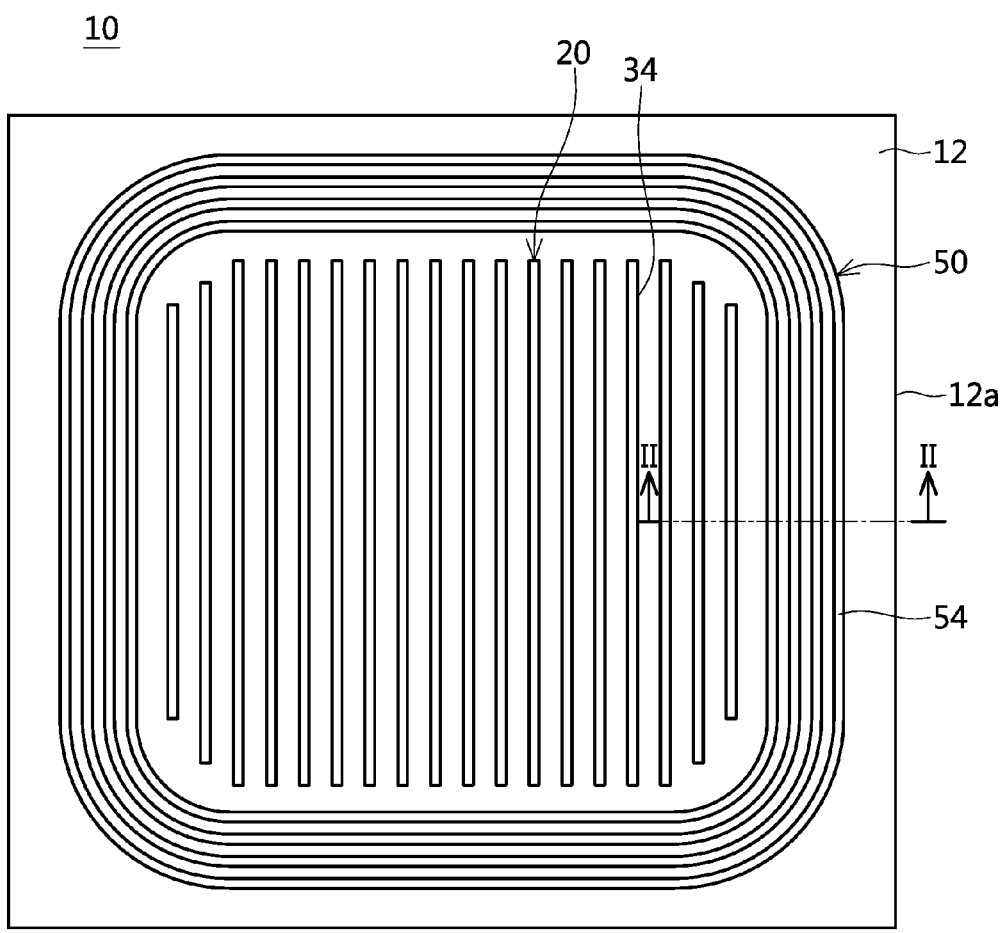
FIG. 1 is an upper view of a semiconductor device 10.

A semiconductor device 10 shown in FIG. 1 comprises a semiconductor substrate 12 configured of SiC. The semiconductor substrate 12 comprises a cell region 20 and a circumferential region 50. The cell region 20 has a MOSFET provided therein. The circumferential region 50 is a region between the cell region 20 and end faces 12a of the semiconductor substrate 12.

Figure 2:
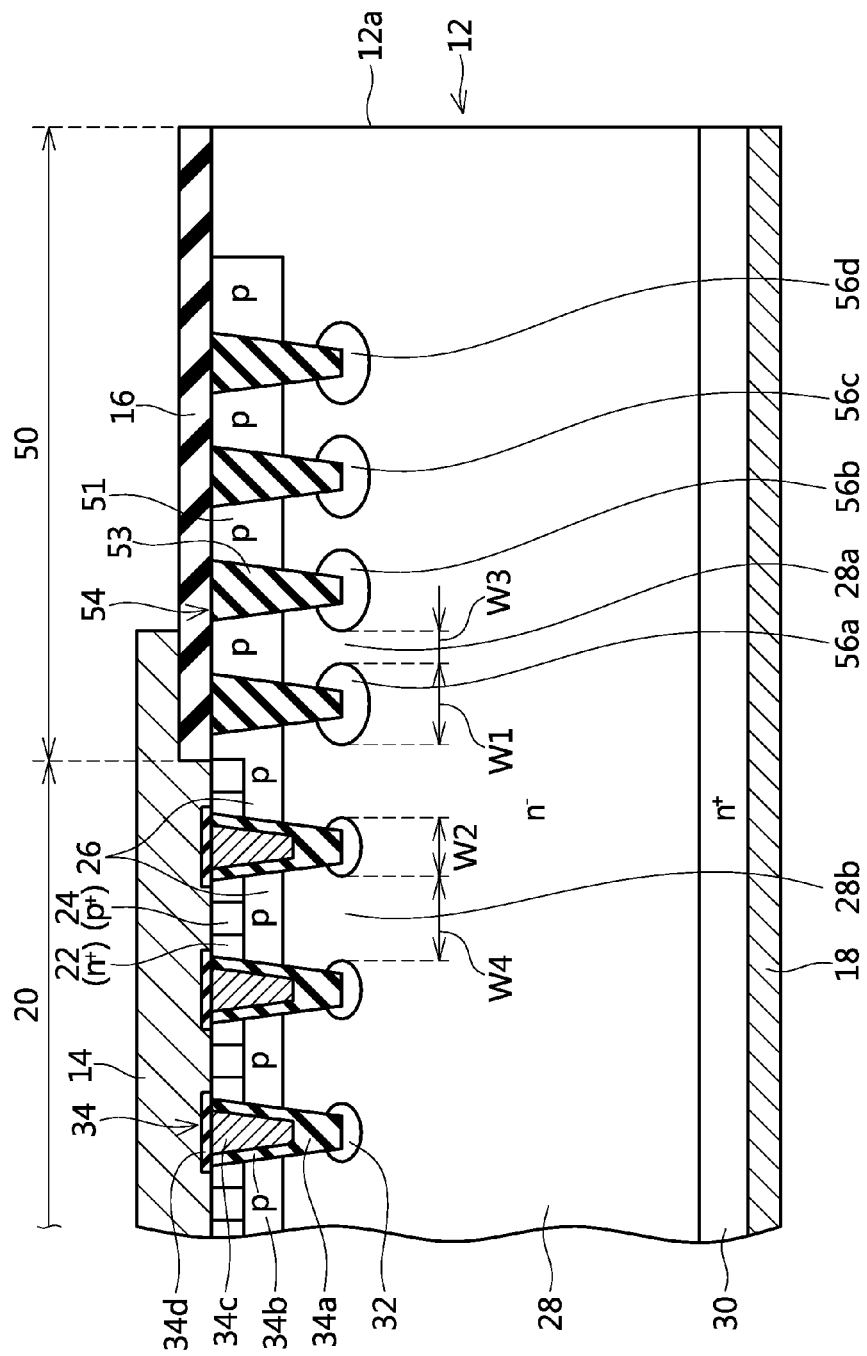
FIG. 2 is a vertical cross-sectional view of the semiconductor device 10 along a line II-II in FIG. 1.

As shown in FIG. 2, a front surface electrode 14 and an insulating film 16 are provided on a front surface of the semiconductor substrate 12. The insulating film 16 covers the front surface of the semiconductor substrate 12 within the circumferential region 50. The front surface electrode 14 is in contact with the semiconductor substrate 12 within the cell region 20. In other words, a region under a contact region where the front surface electrode 14 is in contact with the semiconductor substrate 12 is the cell region 20, and a region on an outer circumferential side than the contact region (end face 12a side) is the circumferential region 50. A rear surface electrode 18 is provided on a rear surface of the semiconductor substrate 12. The rear surface electrode 18 covers substantially an entirety of the rear surface of the semiconductor substrate 12.

Source regions 22, body contact regions 24, a body region 26, a drift region 28, a drain region 30, p-type floating regions 32, and gate trenches 34 are provided in the cell region 20.

The source regions 22 are n-type regions containing n-type impurities at a high concentration. The source regions 22 are provided within ranges that are exposed on an upper surface of the semiconductor substrate 12. The source regions 22 make an ohmic connection to the front surface electrode 14.

The body contact regions 24 are p-type regions containing p-type impurities at a high concentration. The body contact regions 24 are provided to be exposed on the upper surface of the semiconductor substrate 12 at positions where the source regions 22 are not provided. The body contact regions 24 make an ohmic connection to the front surface electrode 14.

The body region 26 is a p-type region containing p-type impurities at a low concentration. The p-type impurity concentration of the body region 26 is lower than the p-type impurity concentration of the body contact regions 24. The body region 26 is provided under the source regions 22 and the body contact regions 24, and is in contact with these regions.

The drift region 28 is an n-type region containing n-type impurities at a low concentration. The n-type impurity concentration of the drift region 28 is lower than the n-type impurity concentration of the source regions 22. The drift region 28 is provided under the body region 26. The drift region 28 is in contact with the body region 26. The drift region 28 is separated from the source regions 22 by the body region 26.

The drain region 30 is an n-type region containing n-type impurities at a high concentration. The n-type impurity concentration of the drain region 30 is higher than the n-type impurity concentration of the drift region 28. The drain region 30 is provided under the drift region 28. The drain region 30 is in contact with the drift region 28, and is separated from the body region 26 by the drift region 28. The drain region 30 is provided in a range that is exposed to a lower surface of the semiconductor substrate 12. The drain region 30 makes an ohmic connection to the rear surface electrode 18.

As shown in FIGS. 1 and 2, the plurality of gate trenches 34 is provided in the upper surface of the semiconductor substrate 12 within the cell region 20. Each of the gate trenches 34 extends straight and parallel to each other in the front surface of the semiconductor substrate 12. Each of the gate trenches 34 is configured to penetrate its corresponding source region 22 and the body region 26, and reach the drift region 28. In each of the gate trenches 34, a bottom insulating layer 34a, a gate insulating film 34b, and a gate electrode 34c are provided. The bottom insulating layers 34a are thick insulating layers provided respectively at bottom portions of the gate trenches 34. Side surfaces of each gate trench 34 above the bottom insulating layer 34a are covered by the gate insulating film 34b. The gate electrodes 34c are provided inside the gate trenches 34 above the bottom insulating layers 34a. The gate electrodes 34c face the source regions 22, the body region 26, and the drift region 28 via the gate insulating films 34b. The gate electrodes 34c are insulated from the semiconductor substrate 12 by the gate insulating films 34b and bottom insulating layers 34a. An upper surface of each gate electrode 34c is covered by an insulating layer 34d. The gate electrodes 34c are insulated from the front surface electrode 14 by the insulating layers 34d.

The p-type floating regions 32 are provided in ranges within the semiconductor substrate 12 that are respectively in contact with bottom surfaces of the gate trenches 34. Peripheries of the p-type floating regions 32 are surrounded by the drift region 28. The p-type floating regions 32 are separated from each other by the drift region 28.

A p-type front surface region 51 is provided in a range exposed on the front surface of the semiconductor substrate 12 within the circumferential region 50. The front surface region 51 extends to a substantially same depth as the body region 26. The aforementioned drift region 28 and drain region 30 extend into the circumferential region 50. The drift region 28 and the drain region 30 extend to the end faces 12a of the semiconductor substrate 12. The drift region 28 is in contact with the front surface region 51 from underneath.

A plurality of circumferential trenches 54 is provided on the upper surface of the semiconductor substrate 12 in the circumferential region 50. The circumferential trenches 54 are configured to penetrate the front surface region 51 and reach the drift region 28. An insulating layer 53 is provided in each of the circumferential trenches 54. As shown in FIG. 1, the circumferential trenches 54 are provided in ring shapes that circumscribe the cell region 20 when the semiconductor substrate 12 is seen from above. The circumferential trenches 54 are provided with clearances in between each other. The front surface region 51 is separated from the body region 26 (that is, a p-type region configured to be electrically conducted with the front surface electrode 14) by the circumferential trenches 54. Further, the front surface region 51 is divided by the circumferential trenches 54 into portions separated from each other.

P-type bottom surface regions 56 are provided in ranges within the semiconductor substrate 12 that are respectively in contact with bottom surfaces of the circumferential trenches 54. The bottom surface regions 56 are respectively provided along the circumferential trenches 54 so as to cover entireties of the bottom surfaces of the circumferential trenches 54. Peripheries of the bottom surface regions 56 are surrounded by the drift region 28. The bottom surface regions 56 are separated from each other by the drift region 28. As shown, a width W1 of the bottom surface regions 56 is wider than a W2 of the p-type floating regions 32. Here, the width W1 of the bottom surface regions 56 means a size of the bottom surface regions 56 in a direction traversing across the circumferential trenches 54 (that is, a width direction of the circumferential trenches 54). Further, the width W2 of the p-type floating regions 32 means a size of the p-type floating regions 32 in a direction traversing across the gate trenches 34 (that is, a width direction of the gate trenches 34).

Next, an operation of the semiconductor device 10 will be described. Upon operating the semiconductor device 10, a voltage that brings the rear surface electrode 18 to be charged positively is applied between the rear surface electrode 18 and the front surface electrode 14. Moreover, the MOSFET in the cell region 20 turns on by a gate-on voltage being applied to the gate electrodes 34c. That is, channels are generated in the body region 26 at positions facing the gate electrodes 34c, and electrons flow from the front surface electrode 14 toward the rear surface electrode 18 through the source regions 22, the channels, the drift region 28, and the drain region 30. At this occasion, the electrons flow through drift region 28b positioned between pairs of p-type floating regions 32. In the semiconductor device 10, the width W2 of the p-type floating regions 32 is set narrow, as a result of which a width W4 of the drift region 28b is set wide. Accordingly, since the width of the drift region 28b where a current flows is ensured to be wide, an on-voltage for the MOSFET is low.

When the application of the gate-on voltage to the gate electrode 34c is stopped, the channels disappear and the MOSFET turns off. When the MOSFET turns off, a depletion layer extends from a pn junction at a boundary between the body region 26 and the drift region 28 into the drift region 28. When the depletion layer reaches the p-type floating regions 32 in the cell region 20, the depletion layer extends from the p-type floating regions 32 into the drift region 28 as well. Due to this, the depletion layer extends in the drift region 28b between two p-type floating regions 32 from the p-type floating regions 32 on its both sides. Accordingly, with the depletion layer expanding within the cell region 20, a high voltage resistance in the cell region 20 is thereby facilitated.

Notably, as aforementioned, the width W4 of the drift region 28b positioned between two p-type floating regions 32 is wide. However, as aforementioned, the drift region 28b is depleted from its both sides. Due to this, the drift region 28b is depleted easily even if the width W4 of the drift region 28b is wide.

Further, the depletion layer extending from the pn junction as aforementioned reaches the bottom surface region 56a under the circumferential trench 54 positioned closest to the cell region 20 side. Then, the depletion layer extends from the bottom surface region 56a toward the bottom surface region 56b on the outer circumferential side. When the depletion layer reaches the bottom surface region 56b, the depletion layer extends from the bottom surface region 56b toward the bottom surface region 56c on the outer circumferential side. Accordingly, in the circumferential region 50, the depletion layer extends to the bottom surface region 56d on the outermost circumferential side by the depletion layer extending sequentially toward the outer circumferential side through the respective bottom surface regions 56. With the depletion layer expanding as above within the circumferential region 50, a high voltage resistance in the circumferential region 50 is facilitated. Notably, in the circumferential region 50, since the depletion layer extends as above, the drift region 28 positioned between the two bottom surface regions 56 is depleted only from one side (cell region 20 side). However, a width W3 of the drift region 28a is made narrow, as a result of which the drift region 28a is surely depleted.

In the present embodiment, the width W3 of the drift region 28a is less than ½ of the width W4 of the drift region 28b. Due to this, the drift region 28a is depleted before the drift region 28b. According to this configuration, when an excessive voltage is applied to the semiconductor device 10, an avalanche breakdown can be generated in the cell region 20. That is, a current passage is small in the circumferential region 50 due to its area being small, as a result of which an avalanche current density therein upon the occurrence of the avalanche breakdown tends to be high. Due to this, the circumferential region 50 has a low avalanche breakdown resistance. Contrary to this, since the cell region 20 has a large area and thus a wide current passage, the avalanche current density is low even in the event of the avalanche breakdown. Due to this, the cell region 20 has a higher avalanche breakdown resistance than the circumferential region 50. Due to this, by configuring the avalanche breakdown to occur in the cell region 20, the avalanche breakdown resistance of the semiconductor device 10 as a whole can be improved.

Next, manufacturing methods of the semiconductor device 10 will be described. Notably, the manufacturing methods disclosed herein are characteristic in their process for forming the p-type floating regions 32 and the bottom surface regions 56, thus hereinbelow, the explanation will primarily be given on the process of forming them. The disclosure proposes first to fourth manufacturing methods.

First Embodiment

Figure 3:
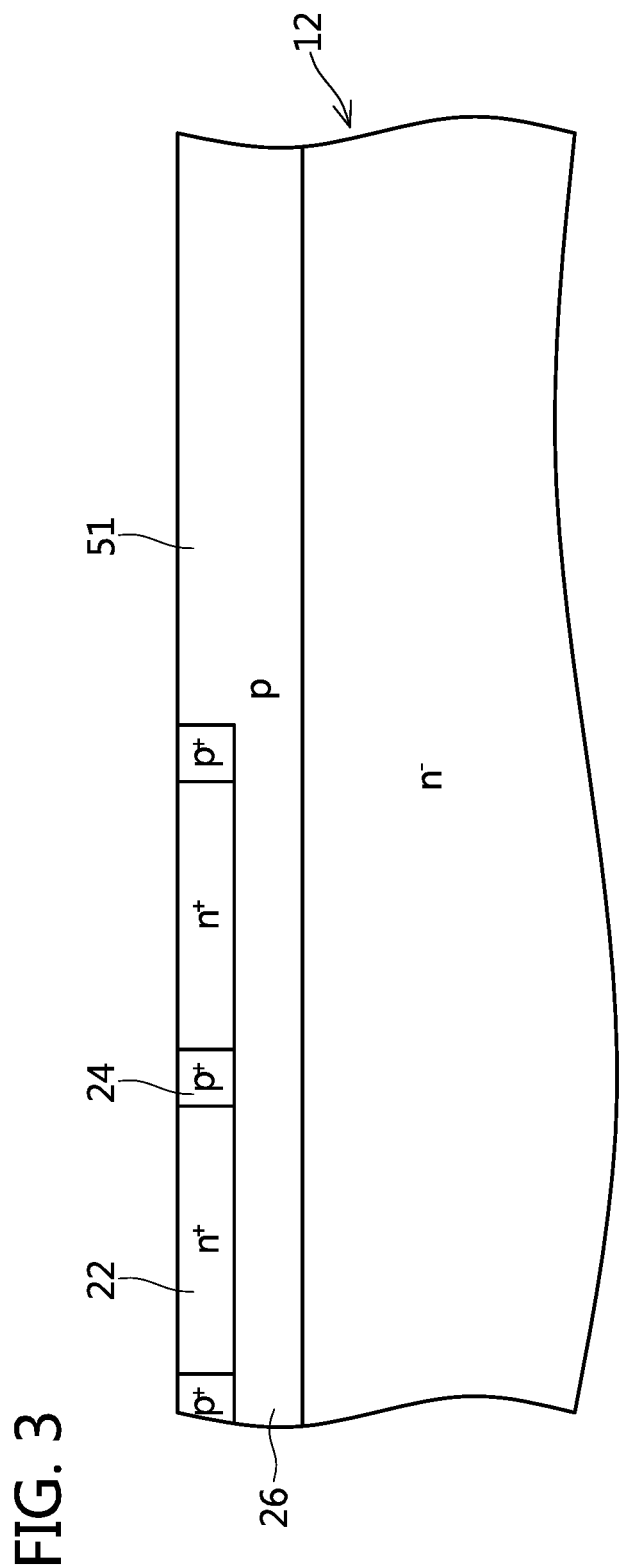
FIG. 3 is an explanatory diagram on a manufacturing method of the semiconductor device 10 (an enlarged cross sectional view of a region where p-type floating regions 32 and bottom surface regions 56 are to be formed)
Figure 4:
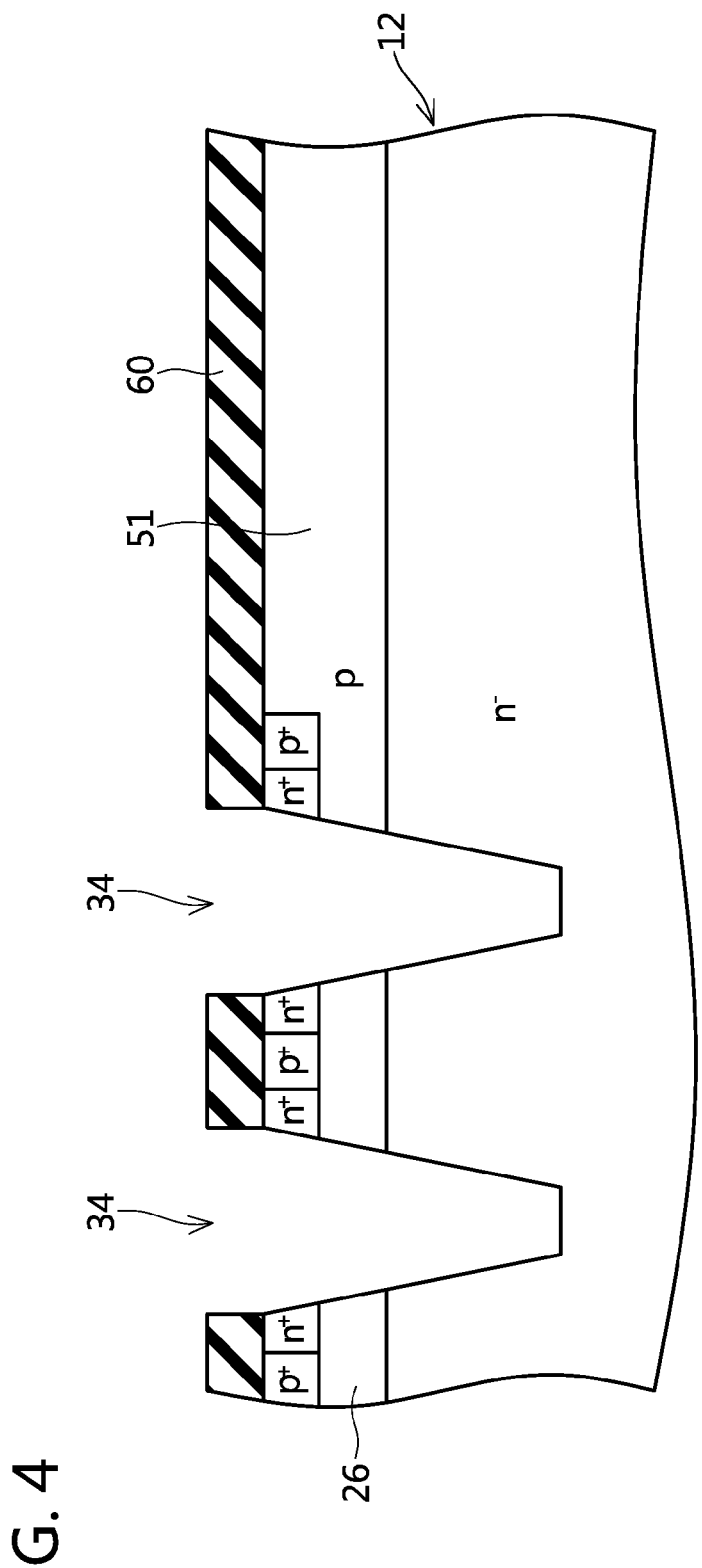
FIG. 4 is an explanatory diagram on the manufacturing method of the semiconductor device 10 (an enlarged cross sectional view of the region where the p-type floating regions 32 and the bottom surface regions 56 are to be formed)
Figure 5:
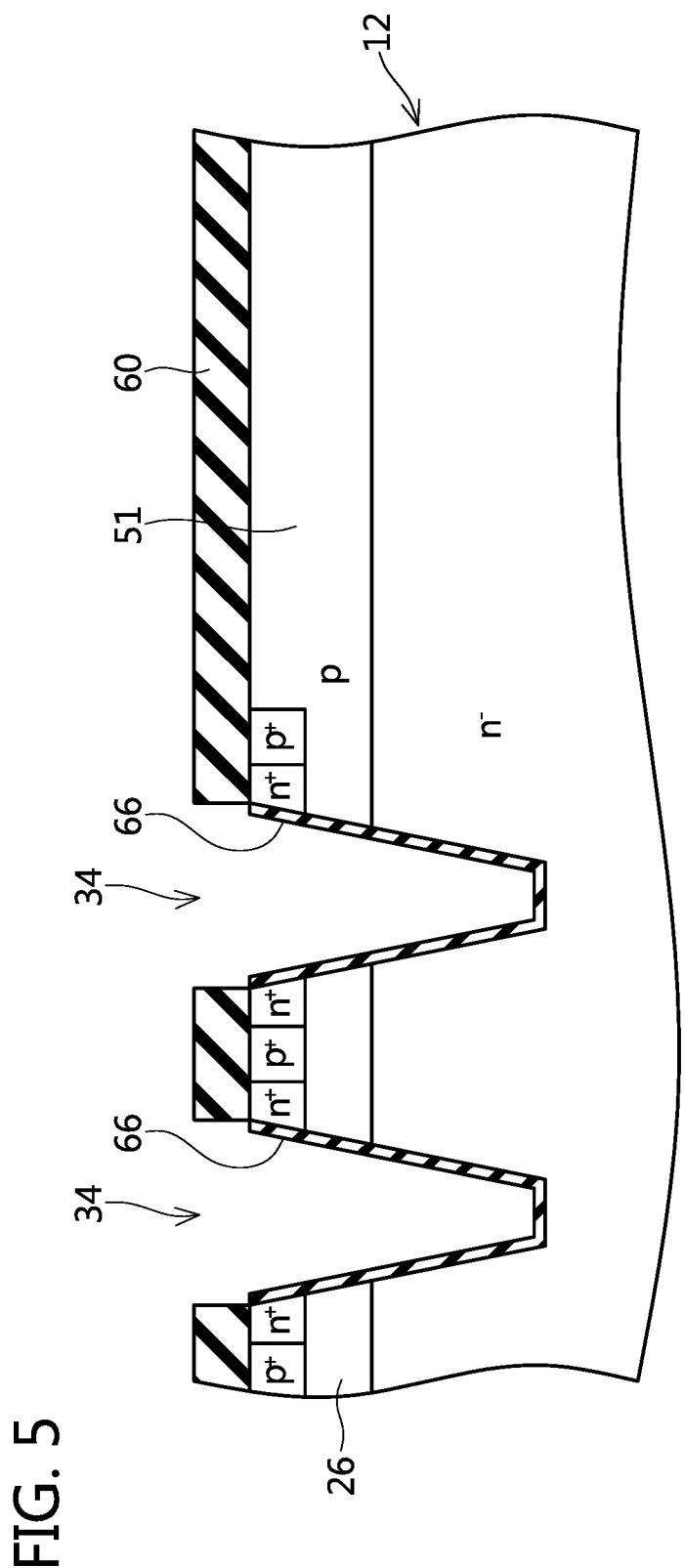
FIG. 5 is an explanatory diagram on the manufacturing method of the semiconductor device 10 (an enlarged cross sectional view of the region where the p-type floating regions 32 and the bottom surface regions 56 are to be formed)

In a manufacturing method of a first embodiment, firstly, as shown in FIG. 3, the source regions 22, the body contact regions 24, the body region 26, and the front surface region 51 are formed in the semiconductor substrate 12 by epitaxial growth, ion implantation, and the like. Then, as shown in FIG. 4, a mask 60 (e.g., an oxide film) provided with openings is formed on the front surface of the semiconductor substrate 12, and the gate trenches 34 are formed by etching the semiconductor substrate 12 within the openings by an anisotropic etching. At this occasion, side surfaces of the gate trenches 34 have a form that is inclined in a tapered shape. Next, as shown in FIG. 5, protective films 66 (oxide films) are formed on inner surfaces of the gate trenches 34 by a CVD method or a thermal oxidation method.

Figure 6:
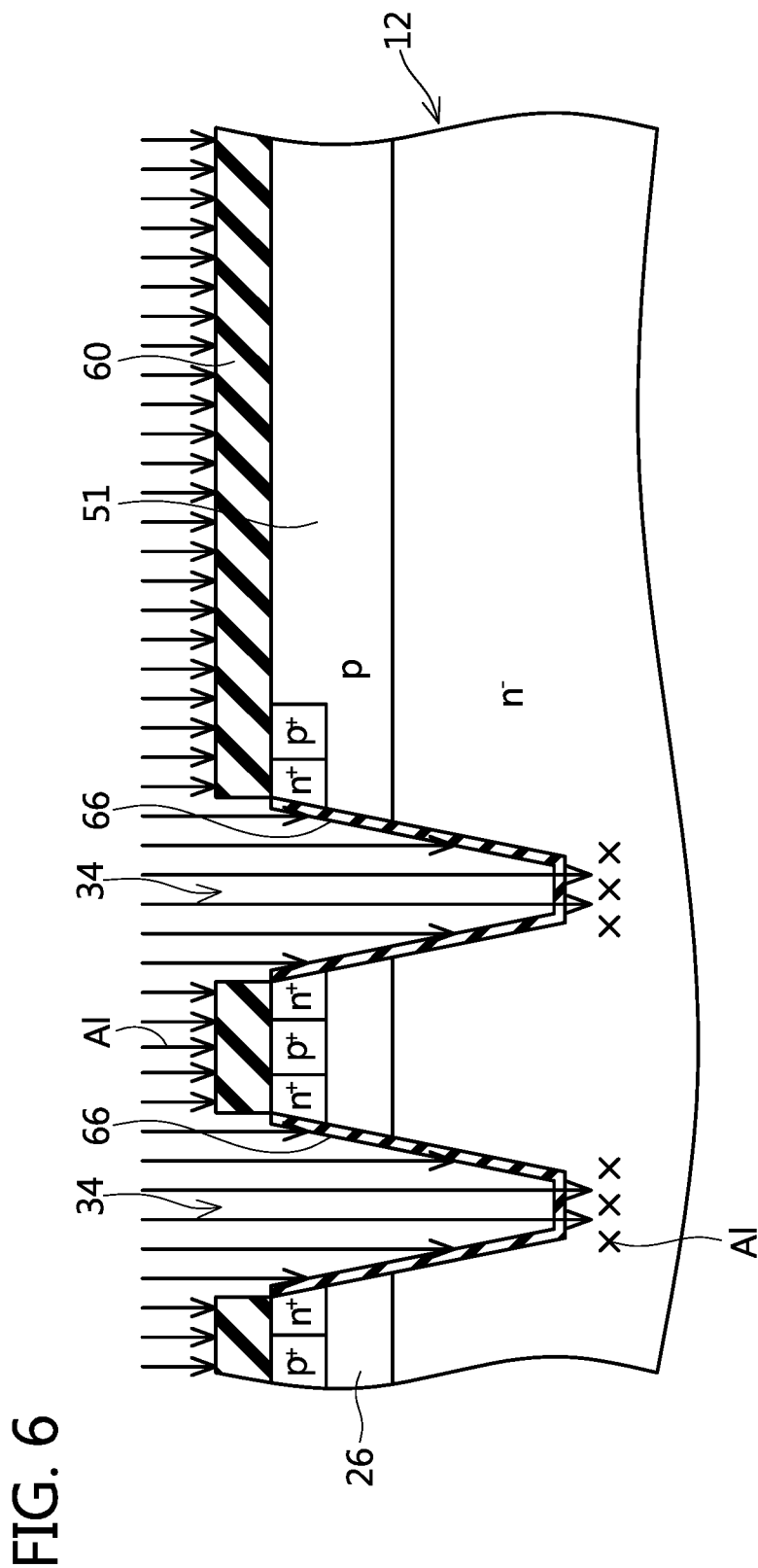
FIG. 6 is an explanatory diagram on the manufacturing method of the semiconductor device 10 (an enlarged cross sectional view of the region where the p-type floating regions 32 and the bottom surface regions 56 are to be formed)

(First Implantation Step) Next, as shown in FIG. 6, Al (aluminum) is irradiated toward the semiconductor substrate 12. The irradiated Al penetrates through the protective films 66 on bottom surfaces of the gate trenches 34, and is implanted to the bottom surfaces of the gate trenches 34. Further, the protective films 66 prevent Al from being implanted to side surfaces of the gate trenches 34. Accordingly, Al is implanted only to the bottom surfaces of the gate trenches 34. Then, the mask 60 and the protective films 66 are removed.

Figure 7:
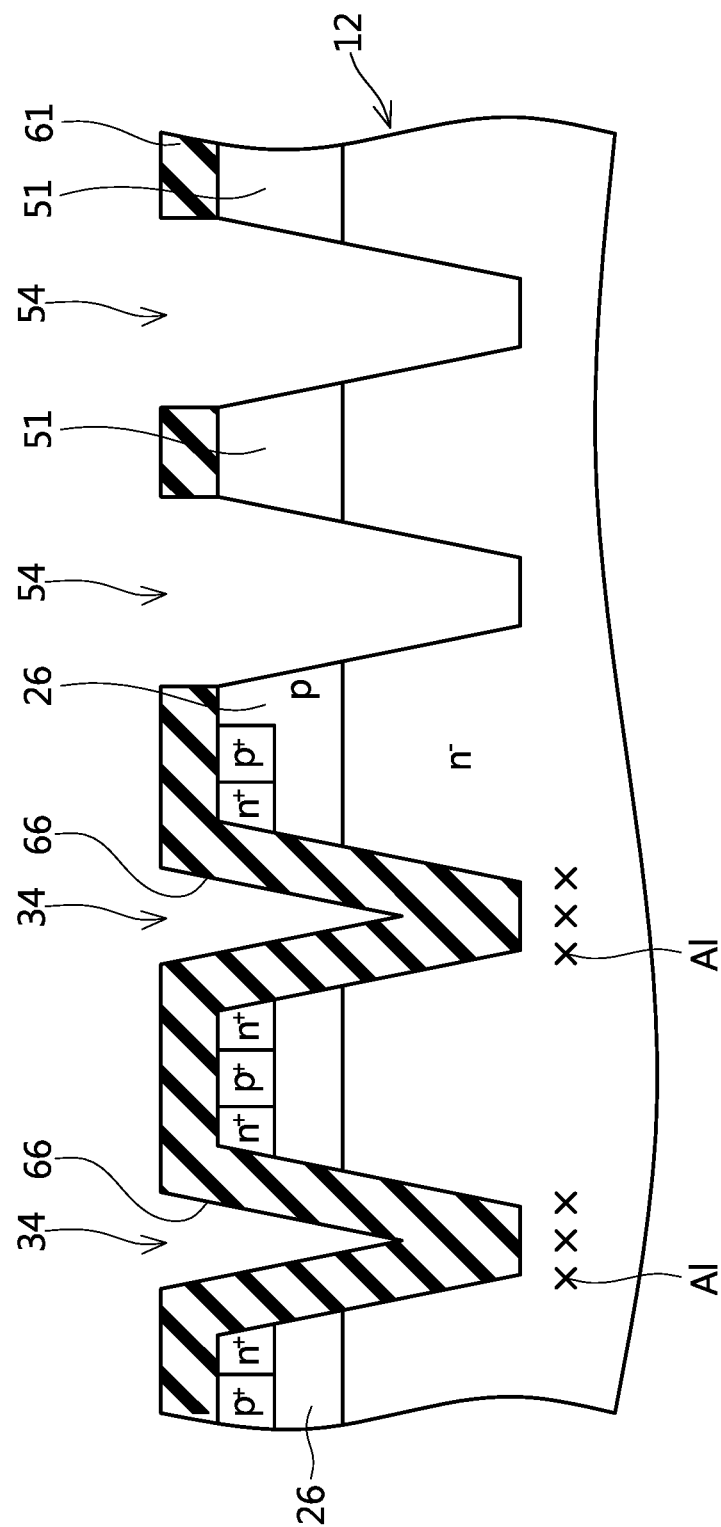
FIG. 7 is an explanatory diagram on the manufacturing method of the semiconductor device 10 (an enlarged cross sectional view of the region where the p-type floating regions 32 and the bottom surface regions 56 are to be formed)
Figure 8:
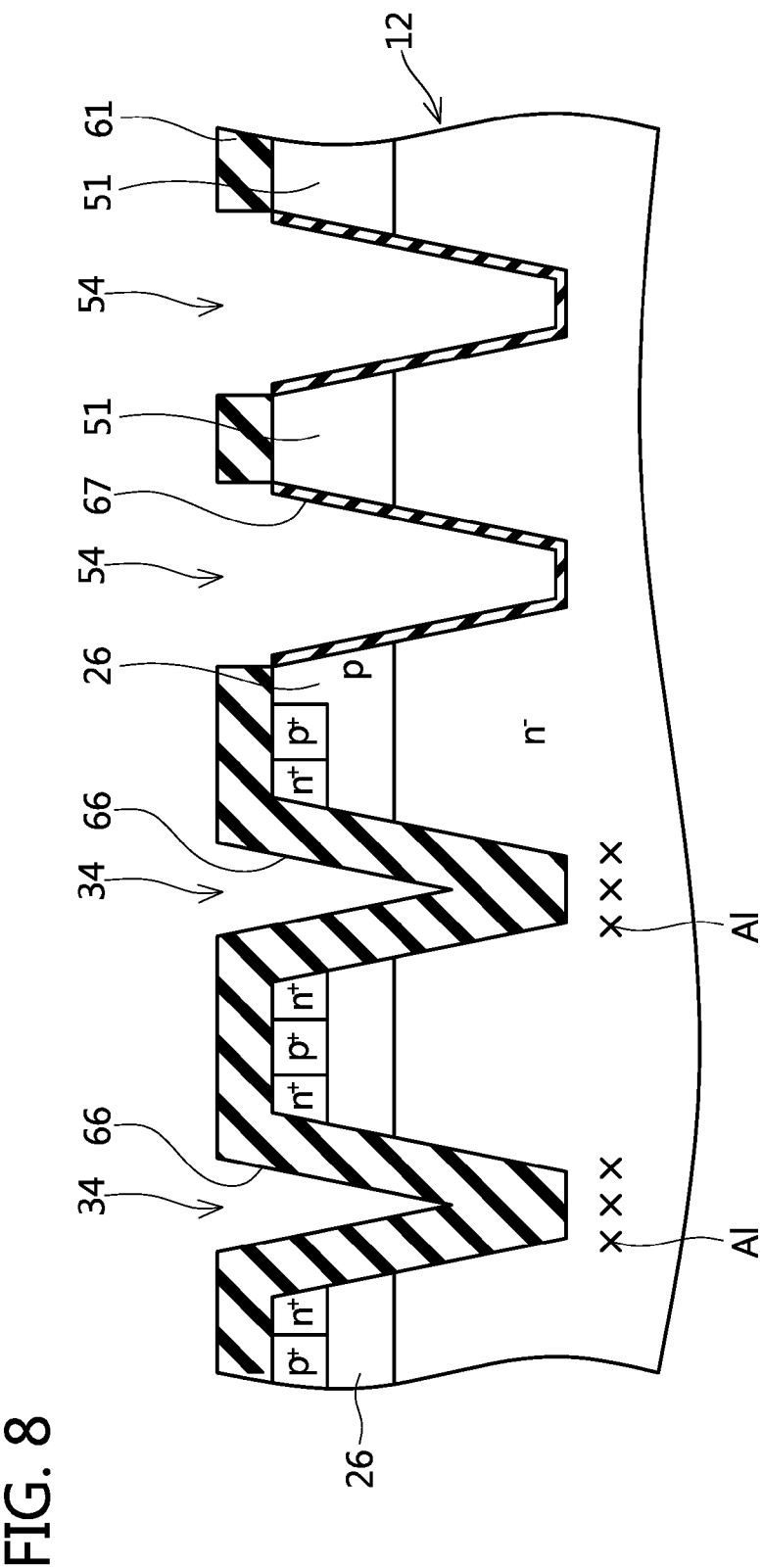
FIG. 8 is an explanatory diagram on the manufacturing method of the semiconductor device 10 (an enlarged cross sectional view of the region where the p-type floating regions 32 and the bottom surface regions 56 are to be formed)

Next, as shown in FIG. 7, a mask 61 (for example, oxide film) having openings is formed on the front surface of the semiconductor substrate 12, and the circumferential trenches 54 are formed by etching the semiconductor substrate 12 within the openings by the anisotropic etching. At this occasion, side surfaces of the circumferential trenches 54 have a form that is inclined in a tapered shape. Next, as shown in FIG. 8, protective films 67 (oxide films) are formed on inner surfaces of the circumferential trenches 54 by the CVD method or the thermal oxidation method.

Figure 9:
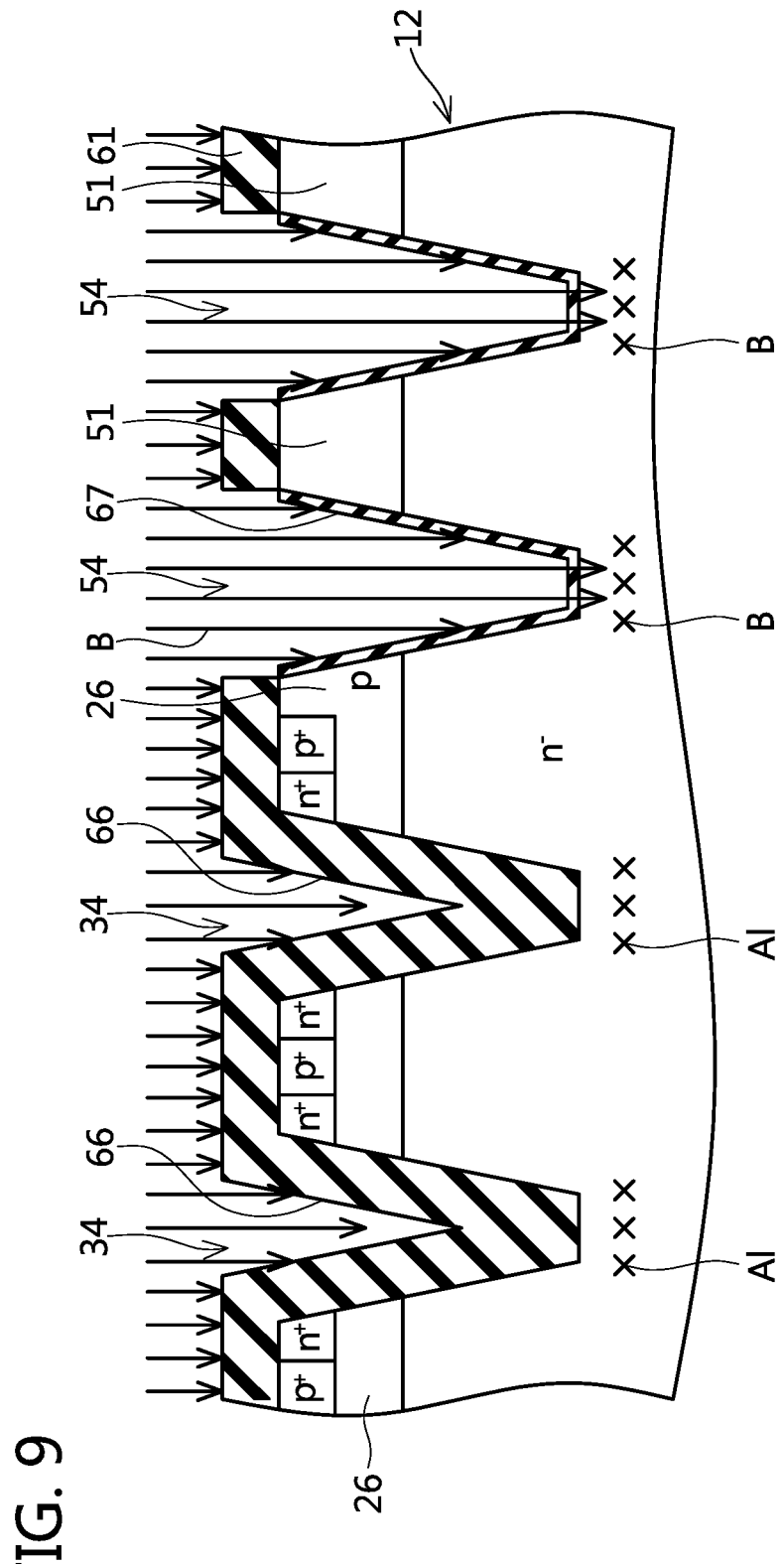
FIG. 9 is an explanatory diagram on the manufacturing method of the semiconductor device 10 (an enlarged cross sectional view of the region where the p-type floating regions 32 and the bottom surface regions 56 are to be formed)

(Second Implantation Step) Next, as shown in FIG. 9, B (boron) is irradiated toward the semiconductor substrate 12. The irradiated B penetrates through the protective films 67 on bottom surfaces of the circumferential trenches 54, and is implanted to the bottom surfaces of the circumferential trenches 54. Further, the protective films 67 prevent B from being implanted to side surfaces of the circumferential trenches 54. Accordingly, B is implanted only to the bottom surfaces of the circumferential trenches 54. Then, the mask 61 and the protective films 67 are removed.

Figure 10:
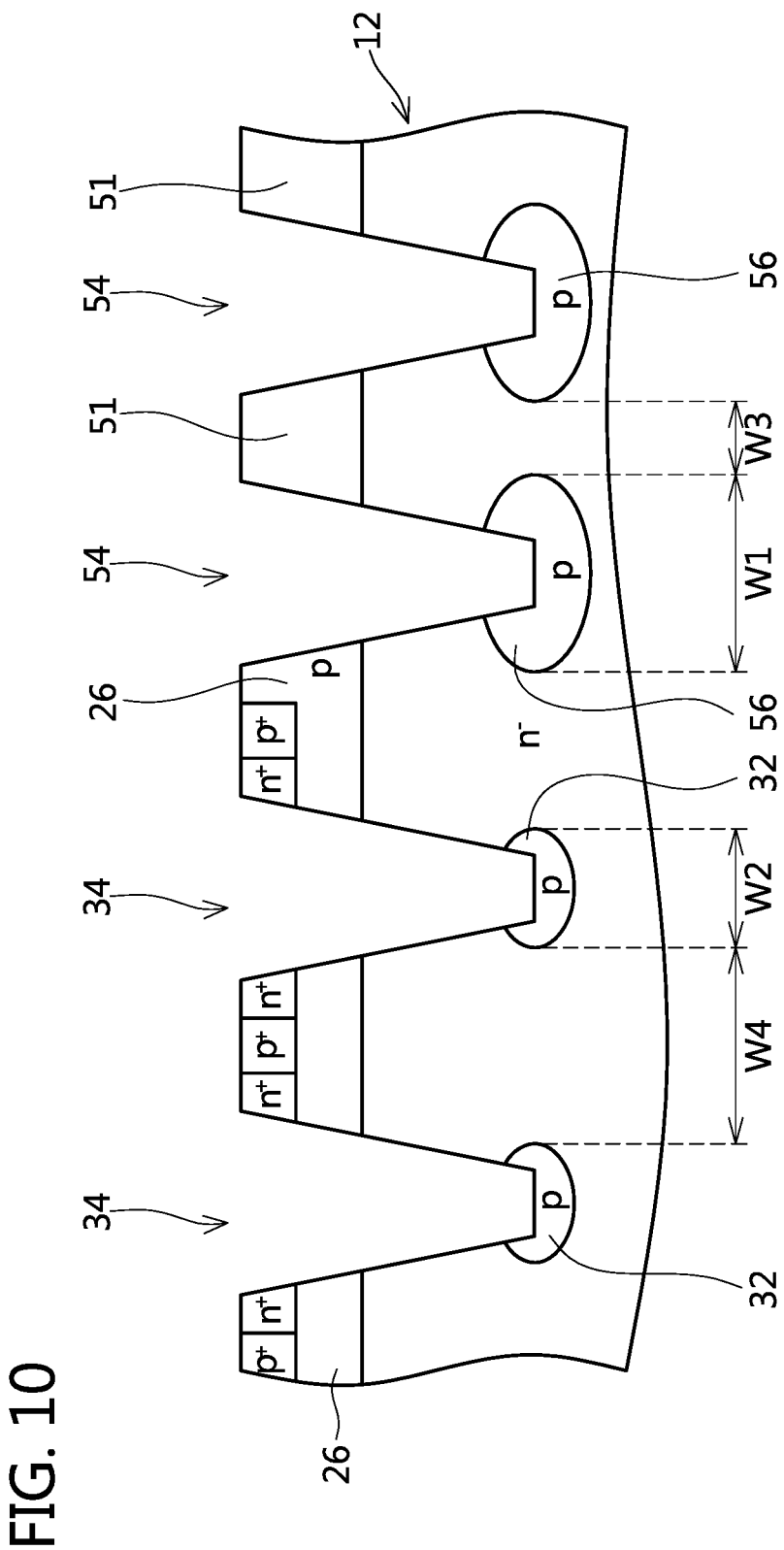
FIG. 10 is an explanatory diagram on the manufacturing method of the semiconductor device 10 (an enlarged crass sectional view of the region where the p-type floating regions 32 and the bottom surface regions 56 are to be formed)

(Activation Annealing Step) Next, the semiconductor substrate 12 is annealed at a temperature equal to or higher than 1600° C. Due to this, the Al and B implanted in the semiconductor substrate 12 are activated. Due to this, as shown in FIG. 10, the p-type floating regions 32 are formed in the peripheries of the bottom surfaces of the gate trenches 34, and the bottom surface regions 56 are formed in the peripheries of the bottom surfaces of the circumferential trenches 54. Here, a diffusion coefficient of B is much larger than a diffusion coefficient of Al in the semiconductor substrate 12 (that is, SiC). Due to this, in the activation annealing step, a diffusion distance of B becomes larger than a diffusion distance of Al. Due to this, as shown in FIG. 10, a size of the bottom surface regions 56 (that is, diffusion ranges of B) becomes larger than a size of the p-type floating regions 32 (that is, diffusion ranges of Al). Thus, a width W1 of the bottom surface regions 56 becomes wider than a width W2 of the p-type floating regions 32, so a clearance W3 between two adjacent bottom surface regions 56 becomes narrower than a clearance W4 between two adjacent p-type floating regions 32. Thereafter, the semiconductor device 10 as shown in FIG. 1 is completed by forming the necessary structure (trench gate structure, insulating layer 16, front surface electrode 14, drain region 30, and rear surface electrode 18 as shown in FIG. 1).

As described above, in the manufacturing method of the first embodiment, B having the large diffusion coefficient is implanted in the bottom surfaces of the circumferential trenches 54 so as to form the bottom surface regions 56 with the wide width W1, whereas on the other hand Al having the small diffusion coefficient is implanted in the bottom surfaces of the gate trenches 34 so as to form the p-type floating regions 32 with the narrow width W2. Accordingly, by using different p-type impurities in the implantation for the bottom surface regions 56 and the p-type floating regions 32, the width of the bottom surface regions 56 can be made wider than the width of the p-type floating regions 32. According to this, the voltage resistance in the circumferential region 50 can be improved by narrowing the width W3 between the bottom surface regions 56 and the on-voltage of the MOSFET can be improved by ensuring the width W4 of the current passages in the cell region 20 to be wide.

Notably, the width W3 between the bottom surface regions 56 can be narrowed by making the clearances between the circumferential trenches 54 narrower. However, due to limitations on processing accuracy of the circumferential trenches 54, there is a limit to making the clearances between the circumferential trenches 54 narrower. Contrary to this, according to the aforementioned method of the first embodiment, the width W3 between the bottom surface regions 56 is narrowed by using the diffusion of B, so the width W3 can be narrowed regardless of the limitations of the processing accuracy of the circumferential trenches 54. Notably, the width W3 can further be narrowed by making the clearances between the circumferential trenches 54 as narrow as possible within a limited range, and forming the bottom surface regions 56 by the implantation of B.

Second Embodiment

In a manufacturing method of the second embodiment, the aforementioned first implantation step is different from the manufacturing method of the first embodiment. Other steps are similar to those of the first embodiment.

In the first implantation step of the second embodiment, C (carbon) is implanted to the bottom surfaces of the gate trenches 34, and then B is implanted to the bottom surfaces of the gate trenches 34. Notably, in the first implantation step, it is preferable to implant C at a higher concentration than B. Further, in the first implantation step, B may be implanted before C. In a second implantation step, similar to the manufacturing method of the first embodiment. B is implanted to the bottom surfaces of the circumferential trenches 54. C is not implanted to the bottom surfaces of the circumferential trenches 54. In the activation annealing step, the semiconductor substrate 12 is annealed similar to the manufacturing method of the first embodiment, and B implanted in the semiconductor substrate 12 is diffused. Here, B implanted in the bottom surfaces of the circumferential trenches 54 is diffused widely similar to the first embodiment. Contrary to this, B implanted in the bottom surfaces of the gate trenches 34 is not diffused so widely. This is because the diffusion coefficient of B in a SiC region where C had been implanted becomes low. Due to this, as shown in FIG. 10, the bottom surface regions 56 with the wide width W1 are formed in the peripheries of the bottom surfaces of the circumferential trenches 54, and the p-type floating regions 32 with the narrow width W2 are formed in the peripheries of the bottom surfaces of the gate trenches 34.

Notably, in the first implantation step of the second embodiment, it is preferable to make a range in which C is implanted larger than a range in which B is implanted. Accordingly, the implantation of C can effectively suppress the diffusion of B even further in the activation annealing step.

Further, in the second implantation step of the second embodiment as well, B and C may be implanted to the bottom surfaces of the circumferential trenches 54. Even in such a configuration, the diffusion distance of B in vicinities of the bottom surfaces of the circumferential trenches 54 becomes longer than the diffusion distance of B in vicinities of the bottom surfaces of the gate trenches 34, so long as a concentration of C implanted in the bottom surfaces of the circumferential trenches 54 is lower than a concentration of C implanted in the bottom surfaces of the gate trenches 34. Accordingly, the bottom surface regions 56 can be formed with greater width than the p-type floating regions 32.

Third Embodiment

In a manufacturing method of the third embodiment, the aforementioned second implantation step is different from the manufacturing method of the first embodiment. Other steps are similar to those of the first embodiment.

In the second implantation step of the third embodiment, B is implanted to the bottom surfaces of the circumferential trenches 54 at an extremely high concentration. Specifically, B is implanted so that at least a part of a semiconductor layer configuring the bottom surfaces of the circumferential trenches 54 comes to contain B at a concentration equal to or higher than $1 \times 1.0^{18}$ atoms/cm$^3$. By implanting B at such a high concentration, a great number of crystal defects is generated in a region where B had been implanted at the high concentration. In some cases, the region where B had been implanted at the high concentration becomes amorphous. As a result, in the region where B had been implanted at the high concentration, the diffusion coefficient of B becomes low.

Figure 11:
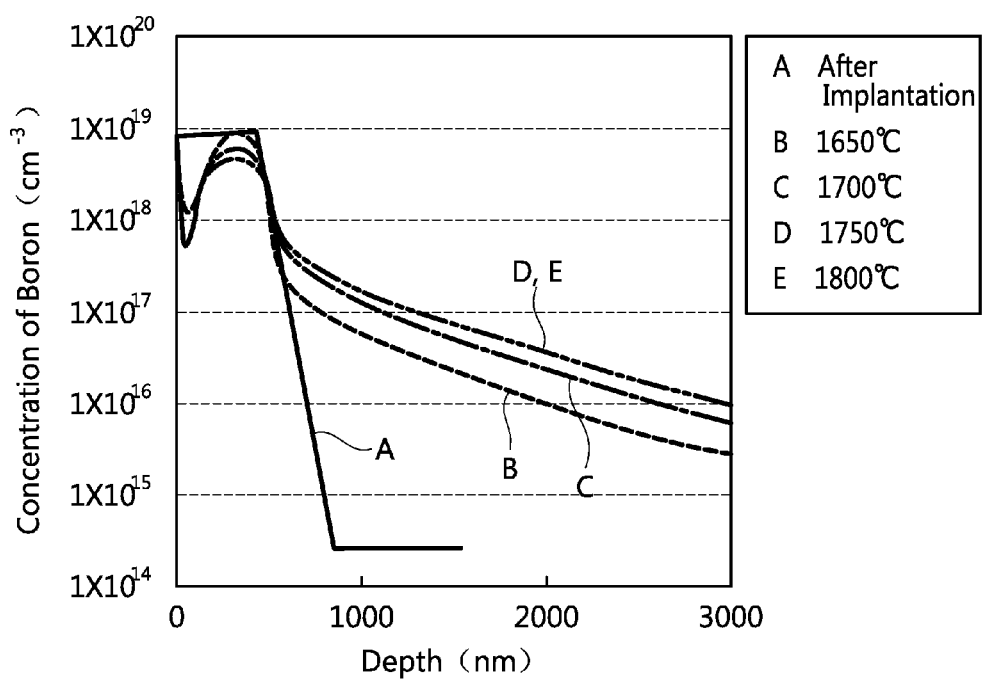
FIG. 11 is a graph showing a diffusion of B in a case of implanting B at a high concentration.

FIG. 11 shows a concentration distribution of B when B is implanted to a shallow region (more specifically, a region shallower than 1000 nm) in the semiconductor substrate configured of SIC. Graph A in FIG. 11 shows a concentration distribution just after the implantation of B. Further, graphs B to E show the concentration distribution after annealing had been performed for 30 minutes at their corresponding temperatures. Notably, in FIG. 11, the graph D and the graph B overlap each other. In the graph A, B is distributed only in the region shallower than 1000 nm. As shown in the graphs B to E, when a heat treatment is performed, the distribution range of B extends in a depth direction. This indicates that B is diffused within SIC. However, as is apparent from a comparison of the graph A and the graphs B to E, the concentration of B does not change so much among the graphs A to E in a region where the concentration of B is equal to or higher than $1 \times 10^{18}$ atoms/cm$^3$. This means that the diffusion of B cannot take place easily in the region that contains B at a high concentration equal to or higher than $1 \times 10^{18}$ atoms/cm$^3$. Since there are a great number of defects present in the region that contains B at a high concentration equal to or higher than $1 \times 10^{18}$ atoms/cm$^3$, and it can be understood that the diffusion coefficient of B therein becomes small.

Figure 12:
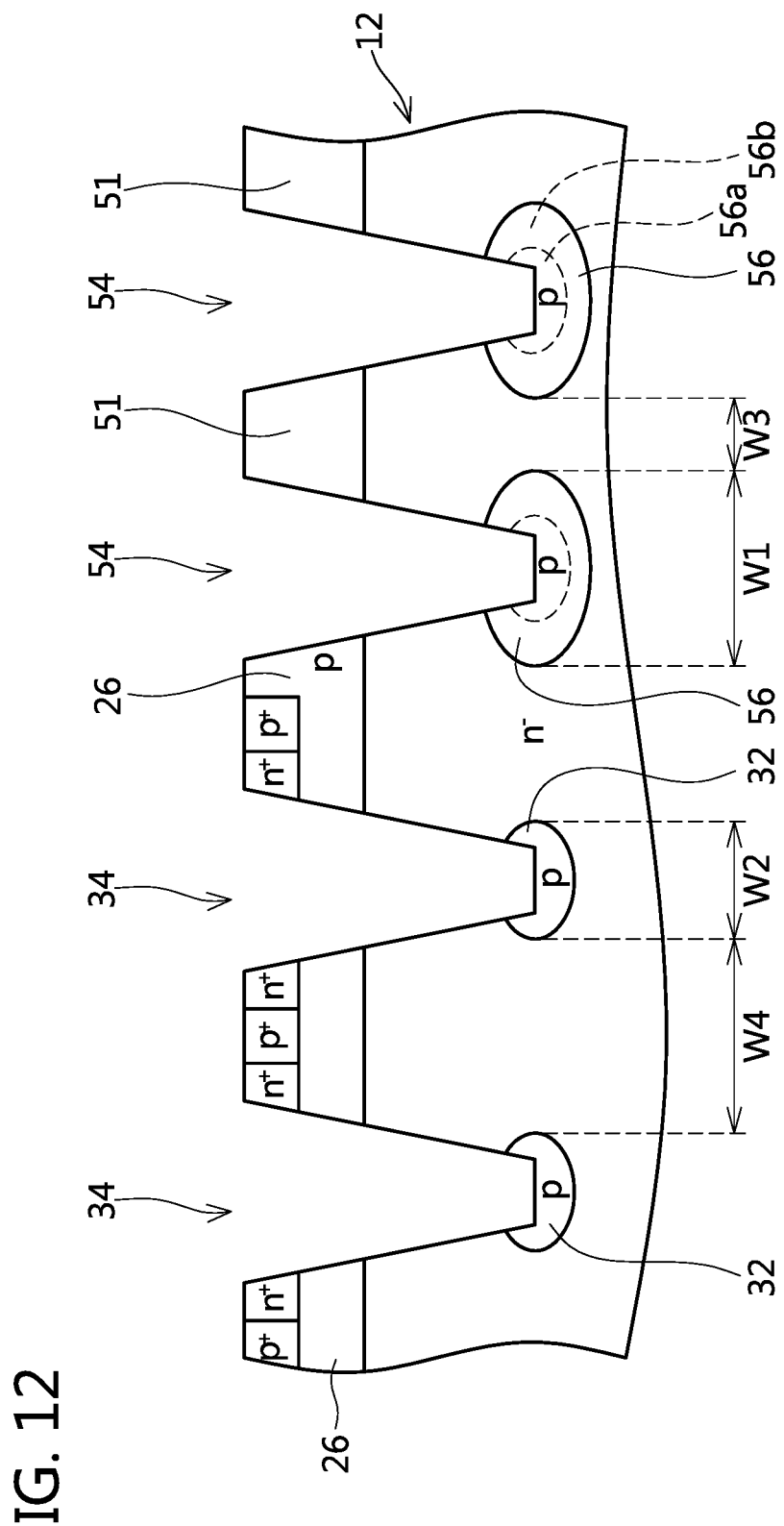
FIG. 12 is an explanatory diagram on the manufacturing method of the semiconductor device 10 (an enlarged cross sectional view of the region where the p-type floating regions 32 and the bottom surface regions 56 are to be formed).

In the manufacturing method of the third embodiment, B is implanted at the high concentration to the bottom surfaces of the circumferential trenches 54 in the second implantation step, and the activation annealing step is performed thereafter. In so doing, the B does not diffuse within the region containing B at the high concentration in the vicinities of the bottom surfaces of the circumferential trenches 54, thus regions with high concentration of B remain in the vicinities of the bottom surfaces of the circumferential trenches 54. Due to this, high-concentration bottom surface regions 56a shown in FIG. 12 are formed. Further, low-concentration bottom surface regions 56b are formed around the high-concentration bottom surface regions 56a due to the wide diffusion of B. Notably, more specifically, the high-concentration bottom surface regions 56a are regions containing B at the concentration equal to or higher than $1 \times 10^{18}$ atoms/cm$^3$, and the low-concentration bottom surface regions 56b are regions containing B at the concentration less than $1 \times 10^{18}$ atoms/cm$^3$. Notably, the high-concentration bottom surface regions 56a may be amorphous regions. Accordingly, if the high-concentration bottom surface regions 56a are formed in the vicinities of the bottom surfaces of the circumferential trenches 54, the depletion layer is prevented from reaching the bottom surfaces of the circumferential trenches 54 upon when the depletion layer extends within the circumferential region 50. Due to this, a high electric field is suppressed from being generated in the vicinities of the bottom surfaces of the circumferential trenches 54. Further, with the low-concentration bottom surface regions 56b being distributed widely, the width W1 of the bottom surface regions 56 is made wide, as a result of which the improvement in the voltage resistance of the circumferential region 50 is obtained.

Fourth Embodiment

In a manufacturing method of the fourth embodiment, the aforementioned second implantation step is different from the manufacturing method of the first embodiment. Other steps are similar to those of the first embodiment.

In the second implantation step of the fourth embodiment, B is implanted to the bottom surfaces of the circumferential trenches 54, and then Al is implanted to the bottom surfaces of the circumferential trenches 54. Notably, Al may be implanted first, and then B may be implanted thereafter. In the activation annealing step, the semiconductor substrate 12 is annealed similar to the manufacturing method of the first embodiment, and the p-type impurities (that is, B and Al) implanted in the semiconductor substrate 12 are diffused. Here, B is diffused widely from the bottom surfaces to their peripheries in the vicinities of the bottom surfaces of the circumferential trenches 54, whereas Al remains in the vicinities of the bottom surfaces due to the difficulty in diffusion. Due to this, as shown in FIG. 12, the high-concentration bottom surface regions 56a with the high p-type impurity concentration are formed in the vicinities of the bottom surfaces of the circumferential trenches 54, and the low-concentration bottom surface regions 56b with the low p-type impurity concentration are formed around the high-concentration bottom surface regions 56a. In the fourth embodiment, the high-concentration bottom surface regions 56a are regions where Al exists in large quantity, and the low-concentration bottom surface regions 56b are regions where B exists in large quantity. Accordingly, in the semiconductor device 10 manufactured by the manufacturing method of the fourth embodiment as well, the depletion layer is prevented from reaching the bottom surfaces of the circumferential trenches 54 upon when the depletion layer extends within the circumferential region 50. Due to this, a high electric field is suppressed from being generated in the vicinities of the bottom surfaces of the circumferential trenches 54.

As described above, in the manufacturing methods of the first to fourth embodiments, the p-type impurities and/or elements to be implanted together with the p-type impurities are selected so that the diffusion distance of the p-type impurities in the activation annealing step becomes longer for the p-type impurities implanted in the bottom surfaces of the circumferential trenches 54 than for the p-type impurities implanted in the bottom surfaces of the gate trenches 34. Due to this, the formation of the bottom surface regions 56 with wider width than the p-type floating regions 32 is facilitated. Notably, in the aforementioned first to fourth embodiments, Ga (gallium) or In (indium) may be used instead of Al as the p-type impurities, Ga and In have short diffusion distances within SiC, thus they can be used similar to Al. Further, the diffusion distances of Al, Ga, In are shorter than the diffusion distance of B in the case where B and C are implanted. Thus, in the first implantation step, Al, Ga, or In may be implanted to the bottom surfaces of the gate trenches 34, and in the second implantation step, C and B may be implanted to the bottom surfaces of the circumferential trenches 54. Further, the second implantation steps of the third and fourth embodiments may be adapted to the second embodiment.

Notably, in the aforementioned embodiments, the semiconductor substrate made of SiC is used, however, other semiconductor substrates may be used. However, in the semiconductor substrate made of SiC, the diffusion coefficient of B is extremely larger than the diffusion coefficients of other p-type impurities. Thus, the width of the p-type floating regions 32 can be minimized and the width of the bottom surface regions 56 can be made sufficiently wide by adapting the embodiments to the semiconductor substrate made of SiC.

Further, in the aforementioned embodiments, the manufacturing methods for MOSFETs have been described, however, the aforementioned technique may be adapted to manufacturing processes for other insulated gate type semiconductor devices such as IGBTs.

Further, in the aforementioned embodiments, the p-type floating regions 32 are provided at the lower ends of the gate trenches 34, however, p-type regions connected to a predetermined potential may be provided instead of the p-type floating regions 32.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

REFERENCE SIGNS LIST

10: Semiconductor Device
12: Semiconductor Substrate
14: Front Surface Electrode
16: Insulating Layer
18: Rear Surface Electrode
20: Cell Region
22: Source Region
24: Body Contact Region
26: Body Region
28: Drift Region
30: Drain Region
32: P-Type Floating Region
34: Gate Trench
34a: Bottom Insulating Layer
34b: Gate Insulating Film
34c: Gate Electrode
34d: Insulating Layer
50: Circumferential Region
51: Front Surface Region
53: Insulating Layer
54: Circumferential Trench
56: Bottom Surface Region

The invention claimed is:
1. An insulated gate type semiconductor device, comprising:
a semiconductor substrate;
a front surface electrode provided on a front surface of the semiconductor substrate; and
a rear surface electrode provided on a rear surface of the semiconductor substrate,
wherein the insulated gate type semiconductor device is configured to switch between the front surface electrode and the rear surface electrode,
the insulated gate type semiconductor device comprises:
a first region of a first conductivity type connected to the front surface electrode;
a second region of a second conductivity type being in contact with the first region;
a third region of the first conductivity type separated from the first region by the second region;
a plurality of gate trenches provided in the front surface and penetrating the first region and the second region to reach the third region;
gate insulating films and gate electrodes provided in the gate trenches;
fourth regions of the second conductivity type provided in an area exposed on bottom surfaces of the gate trenches;
a plurality of circumferential trenches provided in the front surface at positions where the circumferential trenches are not in physical contact with the second region;
insulating layers provided in the circumferential trenches; and
fifth regions of the second conductivity type provided in an area exposed on bottom surfaces of the circumferential trenches,
wherein
a width of the fifth regions is wider than a width of the fourth regions, and
second conductivity type impurities included in the fourth regions are different from second conductivity type impurities included in the fifth regions.

2. The insulated gate type semiconductor device of claim 1, wherein at least parts of the bottom surfaces of the circumferential trenches are configured of amorphous layers.

3. The insulated gate type semiconductor device of claim 1, wherein at least parts of the bottom surfaces of the circumferential trenches include second conductivity impurities at a density equal to or higher than $1\times10^{18}$ atoms/cm$^3$.

4. The insulated gate type semiconductor device of claim 1, wherein a clearance between each pair of adjacent fifth regions is less than half of a clearance between each pair of adjacent fourth regions.

5. An insulated gate type semiconductor device, comprising:
a semiconductor substrate;
a front surface electrode provided on a front surface of the semiconductor substrate; and
a rear surface electrode provided on a rear surface of the semiconductor substrate,
wherein the insulated gate type semiconductor device is configured to switch between the front surface electrode and the rear surface electrode,
the insulated gate type semiconductor device comprises:
a first region of a first conductivity type connected to the front surface electrode;
a second region of a second conductivity type being in contact with the first region;
a third region of the first conductivity type separated from the first region by the second region;
a plurality of gate trenches provided in the front surface and penetrating the first region and the second region to reach the third region;
gate insulating films and gate electrodes provided in the gate trenches;
fourth regions of the second conductivity type provided in an area exposed on bottom surfaces of the gate trenches;
a plurality of circumferential trenches provided in the front surface at positions where the circumferential trenches are not in physical contact with the second region;
insulating layers provided in the circumferential trenches; and
fifth regions of the second conductivity type provided in an area exposed on bottom surfaces of the circumferential trenches,
wherein
a width of the fifth regions is wider than a width of the fourth regions,
second conductivity type impurities included in the fourth regions and second conductivity type impurities in the fifth regions are boron, and
carbon is further included in the fourth regions.

6. An insulated gate type semiconductor device, comprising:
a semiconductor substrate;
a front surface electrode provided on a front surface of the semiconductor substrate; and
a rear surface electrode provided on a rear surface of the semiconductor substrate,
wherein the insulated gate type semiconductor device is configured to switch between the front surface electrode and the rear surface electrode,
the insulated gate type semiconductor device comprises:
a first region of a first conductivity type connected to the front surface electrode;
a second region of a second conductivity type being in contact with the first region;
a third region of the first conductivity type separated from the first region by the second region;
a plurality of gate trenches provided in the front surface and penetrating the first region and the second region to reach the third region;
gate insulating films and gate electrodes provided in the gate trenches;
fourth regions of the second conductivity type provided in an area exposed on bottom surfaces of the gate trenches;
a plurality of circumferential trenches provided in the front surface at positions where the circumferential trenches are not in physical contact with the second region;
insulating layers provided in the circumferential trenches; and
fifth regions of the second conductivity type provided in an area exposed on bottom surfaces of the circumferential trenches,
wherein
a width of the fifth regions is wider than a width of the fourth regions,
a first specific kind of second conductivity type impurities and a second specific kind of second conductivity type impurities are included in the fifth regions, and
a diffusion coefficient of the second specific kind of second conductivity type impurities in the semiconductor substrate is smaller than a diffusion coefficient of the first specific kind of second conductivity type impurities in the semiconductor substrate.

* * * * *